(12) United States Patent
Farrokhian

(10) Patent No.: US 10,408,865 B2
(45) Date of Patent: Sep. 10, 2019

(54) POWER MONITOR PROTECTIVE SHROUD

(71) Applicant: GRID20/20, In., Richmond, VA (US)

(72) Inventor: Shahram Farrokhian, Richmond Hill (CA)

(73) Assignee: GRID20/20, Inc., Richmond, VA (US)

( * ) Notice: Subject to any disclaimer, the term of this patent is extended or adjusted under 35 U.S.C. 154(b) by 0 days.

(21) Appl. No.: 14/936,296

(22) Filed: Nov. 9, 2015

(65) Prior Publication Data

US 2016/0131504 A1    May 12, 2016

Related U.S. Application Data

(60) Provisional application No. 62/076,683, filed on Nov. 7, 2014.

(51) Int. Cl.

| | | |
|---|---|---|
| *G01D 11/24* | (2006.01) | |
| *G01R 15/18* | (2006.01) | |
| *G01R 21/00* | (2006.01) | |
| *G01R 15/14* | (2006.01) | |
| *G01R 21/06* | (2006.01) | |
| *G01R 31/02* | (2006.01) | |
| *G01R 1/22* | (2006.01) | |

(52) U.S. Cl.
CPC .......... *G01R 21/00* (2013.01); *G01R 15/142* (2013.01); *G01R 21/06* (2013.01); *G01R 31/027* (2013.01); *G01R 1/22* (2013.01)

(58) Field of Classification Search
CPC ...... G01R 21/00; G01R 21/06; G01R 15/142; G01R 1/20; G01R 1/22; G01R 31/207; H01F 27/025; H01F 27/085; H01F 27/02; H01F 27/06; H01F 27/266; H01F 38/34; H01F 27/027; H01F 27/04; H02B 7/00; H02B 7/01; H02B 7/06; H02B 7/08; H02B 5/02

See application file for complete search history.

(56) References Cited

U.S. PATENT DOCUMENTS

| | | | |
|---|---|---|---|
| 2,096,857 A | * | 10/1937 | Pixley .................... G01R 11/04 |
| | | | 292/327 |
| 2,816,947 A | | 6/1953 | Leightner et al. |
| 2,915,720 A | | 1/1955 | Mueller et al. |
| 3,035,209 A | | 10/1957 | Smith, Jr. |
| 3,157,730 A | | 11/1964 | Willox |

(Continued)

FOREIGN PATENT DOCUMENTS

| | | |
|---|---|---|
| EP | 1211789 | 11/2002 |
| WO | WO 2013166428 A1 * 11/2013 | ........... G01R 15/186 |

*Primary Examiner* — Lee Rodak
(74) *Attorney, Agent, or Firm* — Dennen IP Law, LLC

(57) ABSTRACT

A power monitoring system has a power monitoring device that couples to at least one conductor of a transformer and collect data indicative of power usage corresponding to the at least one conductor. Additionally, the power monitoring system may have a protective cover that may comprise a top plate having an arch-shaped back edge adapted to abut and conform with an outside surface of a transformer, a face plate integral with and extending from the top plate and mirroring the outside surface of the transformer, and a bottom plate integral with and extending from the face plate and having an arch-shaped back edge adapted to reasonably abut and conform with the outside surface of the transformer.

12 Claims, 4 Drawing Sheets

(56) References Cited

U.S. PATENT DOCUMENTS

| | | | |
|---|---|---|---|
| 4,005,341 A | | 1/1977 | Uptegraff, Jr. et al. |
| 4,521,955 A | | 6/1985 | Closson et al. |
| 5,312,295 A | | 5/1994 | Young |
| 5,426,360 A | * | 6/1995 | Maraio ............... G01R 15/142 324/126 |
| 5,746,340 A | | 5/1998 | Kearfott et al. |
| 8,284,006 B2 | | 10/2012 | Bacarisse |
| 8,309,845 B2 | | 11/2012 | Wood et al. |
| 8,643,984 B2 | | 2/2014 | Kawakita et al. |
| 8,736,411 B2 | | 5/2014 | Yen |
| 8,759,673 B2 | | 6/2014 | Chen et al. |
| 2005/0257439 A1 | | 11/2005 | Sarver et al. |
| 2009/0066317 A1 | * | 3/2009 | de Buda ............... H04B 3/56 324/103 R |
| 2012/0212883 A1 | * | 8/2012 | Hargreaves ........... H05K 5/04 361/679.01 |
| 2012/0313620 A1 | * | 12/2012 | Swarztrauber ......... G01R 22/10 324/105 |
| 2013/0335062 A1 | * | 12/2013 | de Buda ............... G01R 21/00 324/142 |
| 2014/0265562 A1 | * | 9/2014 | Thompson ............. H02J 4/00 307/17 |
| 2014/0334073 A1 | * | 11/2014 | Thompson ............. H02G 7/00 361/660 |

* cited by examiner

POWER MONITOR PROTECTIVE SHROUD

CROSS REFERENCE TO RELATED APPLICATION

This application claims priority to U.S. provisional patent application Ser. No. 62/076,683 entitled "Power Monitoring Protective Devices and Methods," filed on Nov. 7, 2014, which is incorporated by reference in its entirety.

BACKGROUND

Power is generated, transmitted, and distributed to a plurality of endpoints, such as for example, customer or consumer premises (hereinafter referred to as "consumer premises"). Consumer premises may include multiple-family residences (e.g., apartment buildings, retirement homes), single-family residences, office buildings, event complexes (e.g., coliseums or multi-purpose indoor arenas, hotels, sports complexes), shopping complexes, or any other type of building or area to which power is delivered.

The power delivered to the consumer premises is typically generated at a power station. A power station is any type of facility that generates power by converting mechanical power of a generator into electrical power. Energy to operate the generator may be derived from a number of different types of energy sources, including fossil fuels (e.g., coal, oil, natural gas), nuclear, solar, wind, wave, or hydroelectric. Further, the power station typically generates alternating current (AC) power.

The AC power generated at the power station is typically increased (the voltage is "stepped up") and transmitted via transmission lines typically to one or more transmission substations. The transmission substations are interconnected with a plurality of distribution substations to which the transmission substations transmit the AC power. The distribution substations typically decrease the voltage of the AC power received (the voltage is "stepped down") and transmit the reduced voltage AC power to distribution transformers that are electrically connected to a plurality of consumer premises. Thus, the reduced voltage AC power is delivered to a plurality of consumer premises. Such a web or network of interconnected power components, transmission lines, and distribution lines is often times referred to as a power grid.

Throughout the power grid, measureable power is generated, transmitted, and distributed. In this regard, at particular midpoints or endpoints throughout the grid, measurements of power received and/or distributed may indicate information related to the power grid. Notably, sometimes power monitoring systems are coupled to transformers throughout the grid. These systems measure current and voltage related to power usage of the transformer to which the associated system is coupled. Due to the fact that the transformers are being monitored at remote locations within the grid, the systems sometimes get damaged, e.g., by weather conditions or may experience vandalism, or theft of the meter.

SUMMARY

A power monitoring system of the present disclosure has a power monitoring device that couples to at least one conductor of a transformer and collects data indicative of power usage corresponding to the at least one conductor. Additionally, the power monitoring system may have a protective cover that comprises a top plate having an arch-shaped back edge adapted to abut and conform with an outside surface of a transformer, a face plate integral with and extending from the top plate and mirroring the outside surface of the transformer, and a bottom plate integral with and extending from the face plate and having an arch-shaped back edge adapted to abut and conform with the outside surface of the transformer.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Figure 1:
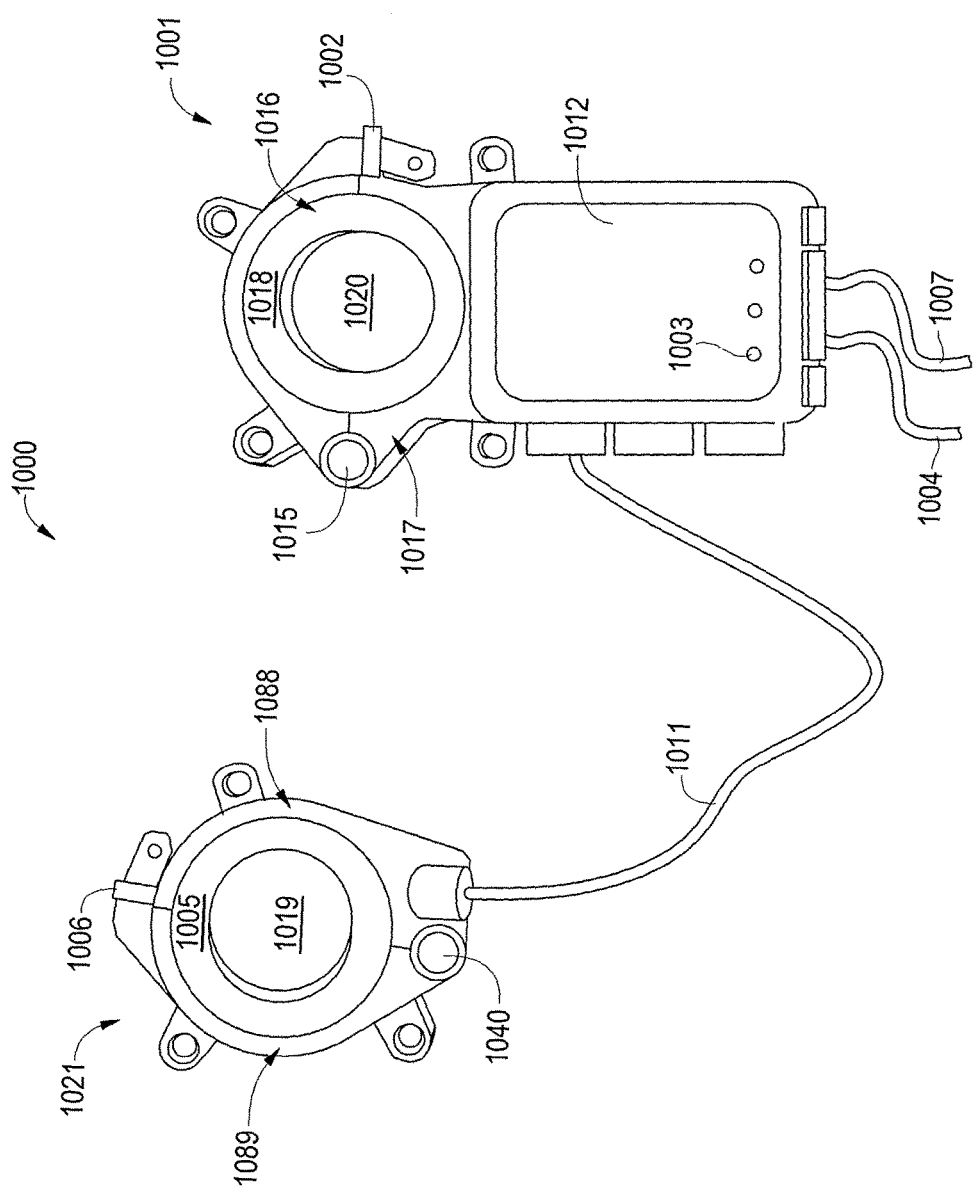
FIG. 1 is a drawing of an exemplary transformer monitoring device in accordance with an embodiment of the present disclosure.

FIG. 1 depicts an exemplary transformer monitoring device 1000 that is used in electrical grids to deliver power to customers. The transformer monitoring device 1000 may be used to monitor current, energy and voltage of a transformer. The transformer monitoring device 1000 may be installed on conductor cables (not shown) and used to collect data indicative of voltage and/or current from the conductor cables to which it is coupled.

The transformer monitoring device 1000 comprises a satellite unit 1021 that is electrically coupled to a main unit 1001 via a cable 1011. The transformer monitoring device 1000 may be used in a number of different methods in order to collect voltage, energy and/or current data from the distribution transformers (not shown). In order to collect voltage, energy and/or current data, the satellite unit 1021 and/or the main unit 1001 is installed around a conductor cable or conductive connectors of conductor cables (also known as a "bushing"), collectively referred to as conductors.

In this regard, the satellite unit 1021 of the transformer monitoring device 1000 comprises two sections 1088 and 1089 that are hingedly coupled at hinge 1040. When installed and in a closed position (as shown in FIG. 1), the sections 1088 and 1089 connect together via a latch 1006 and the conductor cable runs through an opening 1019 formed by coupling the sections 1088 and 1089 at the latch 1006.

The satellite unit 1021 further comprises a sensing unit housing 1005 that houses a current detection device (not shown) for sensing current flowing through the conductor cable around which the sections 1088 and 1089 are installed.

In one embodiment, the current detection device comprises an implementation of one or more coreless current sensor (a Ragowski Coil) as described in U.S. Pat. No. 7,940,039, which is incorporated herein by reference.

The main unit 1001 comprises sections 1016 and 1017 that are hingedly coupled at hinge 1015. When installed and in a closed position (as shown in FIG. 1), the sections 1016 and 1017 connect together via a latch 1002 and a conductor cable runs through an opening 1020 formed by coupling the sections 1016 and 1017.

The main unit 1001 comprises a sensing unit housing section 1018 that houses a current detection device (not shown) for sensing current flowing through the conductor cable around which the sections 1016 and 1017 are installed. As described hereinabove with respect to the satellite unit 1021, the current detection device comprises an implementation of one or more Ragowski coils as described in U.S. Pat. No. 7,940,039, which is incorporated herein by reference.

Unlike the satellite unit 1021, the main unit section 1017 comprises an extended boxlike housing section 1012. Within the housing section 1012 resides one or more printed circuit boards (PCB) (not shown), semiconductor chips (not shown), and/or other electronics (not shown) for performing operations related to the transformer monitoring device 1000. In one embodiment, the housing section 1012 is a substantially rectangular; however, differently sized and differently shaped housings may be used in other embodiments.

Additionally, the main unit 1001 further comprises one or more cables 1004, 1007. The cables 1004, 1007 may be coupled to a conductor cable or corresponding bus bars (not shown) and ground or reference voltage conductor (not shown), respectively, for the corresponding conductor cable, which will be described further herein. Such cables 1004, 1007 are used to measure voltage at the bus bars or the conductor cables.

Note that methods in accordance with an embodiment of the present disclosure use the described monitoring device 1000 for collecting current and/or voltage data. Further note that the monitoring device 1000 described is portable and easily connected and/or coupled to an electrical conductor and/or transformer bushings. Due to the noninvasive method of installing the satellite unit and main unit around a conductor and connecting the leads 1004, 1007 to connection points, an operator (or utility personnel) need not de-energize a transformer to which the monitoring device 1001 is connected for connection or coupling thereto. Further, no piercing (or other invasive technique) of the electrical line is needed during deployment to the power grid. Thus, the monitoring device 1000 is easy to install. Thus, deployment to components in a power grid is easy to effectuate.

During operation, the satellite unit 1021 and/or the main unit 1001 collects data indicative of current through a respective conductor cable. The satellite unit 1021 transmits its collected data via a cable 1011 to the main unit 1001. Additionally, the cables 1004, 1007 may be used to collect data indicative of voltage corresponding to a conductor cable about which the satellite unit is installed, as indicated hereinabove. The data indicative of the current, energy and voltage sensed corresponding to the conductor may then be used to calculate power usage at the electrical grid component to which the monitoring device 1000 is coupled.

As indicated hereinabove, there are a number of different methods that may be employed using the monitoring device 1000 in order to collect current and/or voltage data and calculate power usage. In one embodiment, the transformer monitoring device 1000 may be used to collect voltage and current data from a three phase system or a single phase system.

With respect to a single phase system, the single phase system has two conductor cables and a neutral cable. For example, electricity supplied to a typical home in the United States has two conductor cables (or hot cables) and a neutral cable. Note that the voltage across the conductor cables in such an example is 240 Volts (the total voltage supplied) and the voltage across one of the conductor cables and the neutral is 120 Volts. Such an example is typically viewed as a single phase system.

In a three phase system, there are typically three conductor cables and a neutral cable (sometimes there may not be a neutral cable). In one system, voltage measured in each conductor cable is 120° out of phase from the voltage in the other two conductor cables. Multiple transformer monitoring devices 1000 can obtain current readings from each conductor cable and voltage readings between each of the conductor cables and the neutral (or obtain voltage readings between each of the conductor cables). Such readings may then be used to calculate power usage. In such a scenario, multiple monitoring devices 1000 are connected to the bushings of the component for which power usage data is desired.

As an example, in one embodiment, multiple monitoring devices 1000 may be coupled to multiple bushings of a transformer and collect current and voltage data. In another embodiment, a monitoring device may comprise a controller unit that is coupled to a plurality of satellite units. Each of the plurality of satellite units are coupled to a corresponding conductor in a three phase power system. During operation, each of the plurality of satellite units collects data and transmits data to the controller unit. The controller unit performs calculations and transmits data to other devices and/or systems for use in various applications. One such monitoring device is described in U.S. patent application Ser. No. 14/231,576 entitled Power Monitoring Systems and Methods, which is incorporated herein in its entirety. Note that the main unit 1001 of the general purpose transformer monitoring device 1000 further comprises one or more light emitting diodes (LEDs) 1003. The LEDs may be used by logic to indicate status, operations, or other functions performed by the general purpose transformer monitoring device 1000.

Oftentimes, the monitoring devices 1000 are connected to transformers that are easily accessible by third parties, e.g., individuals. In such a scenario, the transformer monitoring devices 1000 may be easily removed from the component for which it is gathering power data. Thus, there is a risk of vandalism and/or theft associated with the monitoring devices 1000. In addition, while the monitoring devices 1000 may not be easily accessible by third parties, the monitoring devices 1000 may be installed on components in areas where weather may affect the location and operation of the monitoring devices 1000.

Figure 2:
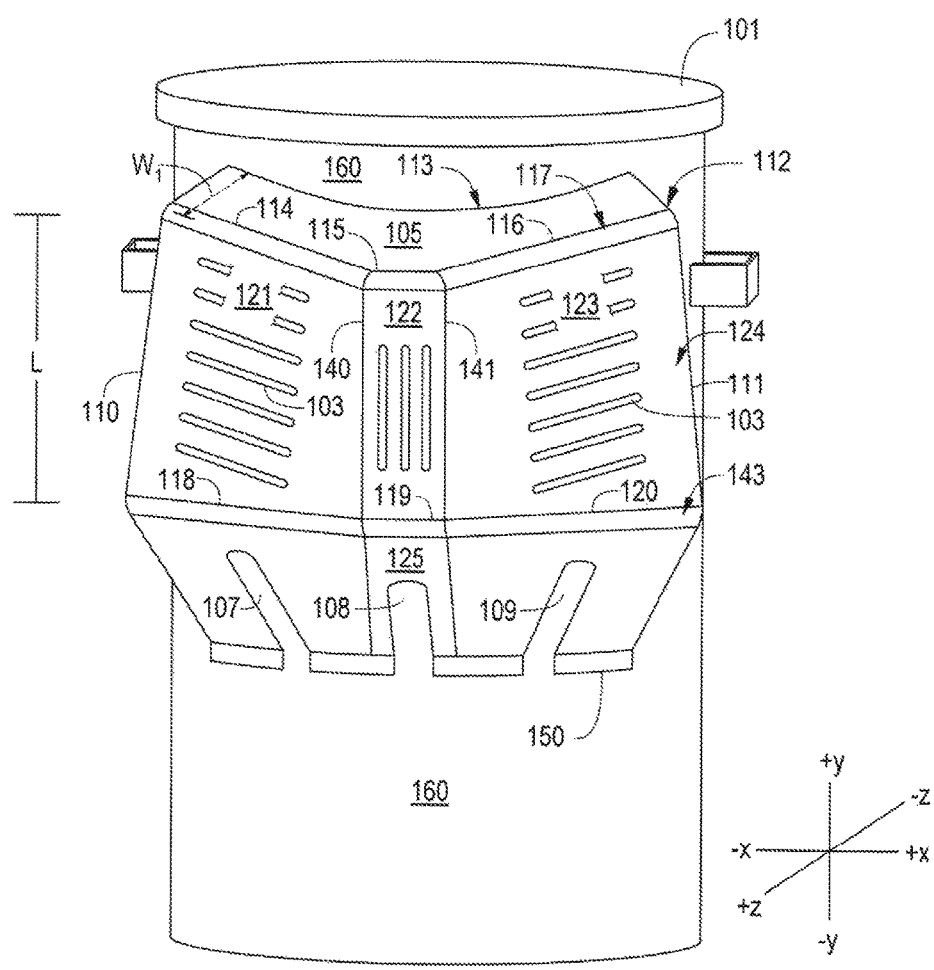
FIG. 2 depicts a perspective view of transformer monitoring device protective cover coupled to a transformer for housing the transformer monitoring device depicted in FIG. 1.

Thus, in accordance with an embodiment, the present disclosure describes a method, but not the only shape/method, for protecting the monitoring devices 1000 from such risks. In this regard, FIG. 2 depicts a transformer 101. The shape and location of the transformer 101 may vary from one implementation to another. For example, the transformer 101 may be positioned at a top of an electrical pole or any other position that would make the transformer useful for delivering power to a residence, place of business or any other utility customer to which the transformer 101 supplies power.

Note that the size and shape of the transformer may differ as well. The embodiment of the transformer 101 depicted in FIG. 2 is cylindrical, but other shapes and sizes may be found in other embodiments of the transformer 101.

In accordance with an embodiment of the present disclosure, a protective cover 112 is coupled to a transformer 101 to protect a monitoring device 1000 coupled to the transformer 101. As described hereinabove, the monitoring device 1000 may be a single device, as shown. In other embodiments, there may be a plurality of conductors protruding from the transformer, and in such an embodiment, multiple monitoring devices 1000 may be coupled to the each of the plurality of conductors. In another embodiment, the monitoring device to be protected by the cover 112 comprises a control unit with a plurality of satellite units for measuring, and each satellite unit couples to one of a plurality of conductors, as described hereinabove. Notably, the present disclosure is not intended to limit the shape, type, or variation of the monitoring device that is to be protected by the cover 112. Note that as discussed herein, a monitoring device 1000 monitors single-phase transformers. However, in accordance with the previous description, the protective cover 112 may also shroud a monitoring device on a three-phase transformer, as well.

The back side of the protective cover 112 is open for receiving and covering the monitoring device 1000. However, the protective cover 112 is adapted for fitting to the transformer.

In this regard, the protective cover 112 comprises an arch-shaped top plate 105 and an arch-shaped bottom plate 125. Integral with and connecting the arch-shaped top plate 105 with the arch-shaped bottom plate 125 is a trapezoidal shaped face plate 124.

The face plate 124 is adapted to mirror the outside surface 160 of the transformer 101 via a trapezoidal configuration. The face plate 124 comprises three plate sections including section 121, 122, and 123. The face plate 124 is trapezoidal-shaped. Further, a top plate edge 117 is the intersection between the face plate 124 and the top plate 105, and the bottom plate edge 143 is the intersection of the face plate 124 and the bottom plate 125. The face plate 124 extends downward from the top plate 105, and in one embodiment substantially mimics the curvature of the outside surface 160 of the transformer.

The middle section 122 is substantially rectangular in shape having edges 115, 140, 141, and 119. Straight edge 140 is the intersection between the middle section 122 and the side section 121, and straight edge 141 is the intersection between the middle section 122 and the section 123. In addition, the middle section 122 intersects with the top plate 105 at edge 117 and the bottom plate at edge 143. In this regard, the middle section shares a top edge 115 with top plate 105 and a bottom edge 119 with the bottom plate 125. The edges 115, 140, 141, and 119 are integral with the respective sections 105, 121, 123, and 125. However, in other embodiments the sections 105, 121, 123, and 125 may be separate components that are coupled together via fasteners. Note that each of the edges 115, 140, 141, and 119 are shown having a radius of curvature. However, a radius of curvature at the edges is not necessary in the present disclosure.

Side section 121 is substantially trapezoidal-shaped, wherein the edge 114 is the intersection between side section 121 and the top plate 105. The edge 114 and the side section 121 extend at an angle from the middle section 122 and the edge 115 in a −x, −z direction. Further, edge 118 is the intersection between the bottom plate 125 and the side section 121. The edge 118 also extends at an angle from the middle section 122 and the edge 119 in a −x and −z direction. In one embodiment, the edges 114 and 118 are parallel; however, the edges 114 and 118 may not be parallel in other embodiments.

Additionally, side section 121 comprises an outside edge 110. In one embodiment, the outside edge 110 may abut and conform to the surface 160 of the transformer 101. However, in other embodiments, the outside edge 110 may not extend all the way to the surface of the transformer 101 thereby leaving an opening not shown in the side of the protective cover for releasing heat.

Within the side section 121 are a plurality of vent slits 103. The vent slits 103 allow heat energy to escape so that the contents, e.g., the monitoring device 1000, do not overheat.

The side section 123 is substantially a mirror image of side section 121. Side section 123 is substantially trapezoidal-shaped, wherein the edge 116 is the intersection between side section 123 and the top plate 105. The edge 116 and the side section 123 extend at an angle from the middle section 122 and the edge 115 in a +x, −z direction. Further, edge 120 is the intersection between the bottom plate 125 and the side section 123. The edge 120 also extends at an angle from the middle section 122 and the edge 119 in a +x and −z direction. In one embodiment, the edges 116 and 120 are parallel; however, the edges 116 and 120 may not be parallel in other embodiments.

Additionally, side section 123 comprises an outside edge 111. In one embodiment, the outside edge 111 may abut and conform to the surface 160 of the transformer 101. However, in other embodiments, the outside edge 111 may not extend all the way to the surface of the transformer 101 thereby leaving an opening not shown in the side of the protective cover for releasing heat.

Within the side section 123 are a plurality of vent slits 103. The vent slits 103 allow heat energy to escape so that the contents, e.g., the monitoring device 1000, do not overheat.

The arch-shaped top plate 105 comprises an arch-shaped back edge 113 that interfaces with an outer surface 160 of the transformer 101. Note that the back side of the In this regard, the arch-shaped back edge 113 abuts and conforms to the outer surface 160 of the transformer. The arch-shaped back edge 113 is adapted and configured to fit snugly to the cylindrical outside surface 160 of the transformer 101. Note that in other embodiments, if the transformer 101 took on a different shape, the back edge 113 would mirror the shape of the transformer 101. Thus, debris or precipitation would be unable to flow through the protective cover from the top side of the protective cover 112.

In addition, the arch-shaped top plate 105 comprises the front edge 117 that has three sections, including a middle edge 115, an edge 114 that extends at an angle in a −x, −z direction from the middle edge 115, and an edge 116 that extends at an angle in a +x, −z direction mirroring edge 114. The edges 114, 115, and 116 are arranged in a V-shaped formation that corresponds to the arch-shaped edge 113 that snugly fits to the transformer 101.

The width of $W_1$ of the upper face 105 is adapted and configured for retaining the monitoring device 1000 within the protective cover 112 without interfering with the monitoring device's performance. However, a particular width is not necessary in the present disclosure. As an example, width $W_1$ may be at least 4 inches, which would allow the monitoring device 1000 to be effectively housed within the protective cover 112.

The bottom plate 125 extends angularly downwardly from the edge 143. The bottom plate 125 comprises three slits 107, 108, and 109 through which conductor cables (not shown) may be inserted. Further, bottom plate 125 comprises a lip 150 that extends downwardly and rests against the outside surface 160 of the transformer 101.

Notably edge-intersections of the adjoined integral plates that are configured in the embodiment as having curvatures. However, a curvature is not necessary in other embodiments of the present disclosure. Further note that the face plate 124 is integral with the top plate 105; however, in another embodiment, the face plate 124 and top plate 105 may be separate pieces that are coupled together via Furthermore, the protective cover 112 may take on any number of shapes and forms other than the particular shape and form depicted in FIG. 2. As an example, the back edge 113 may be configured to conform to the outside surface 160 of the transformer 160. However, in another embodiment, the sections 121, 122, and 123 need not arch-shaped as shown. As an example, the enclosure could be in the shape of a square wherein the only a single face plate be needed without the arch shape of sections 121, 122, and 123.

Figure 3:
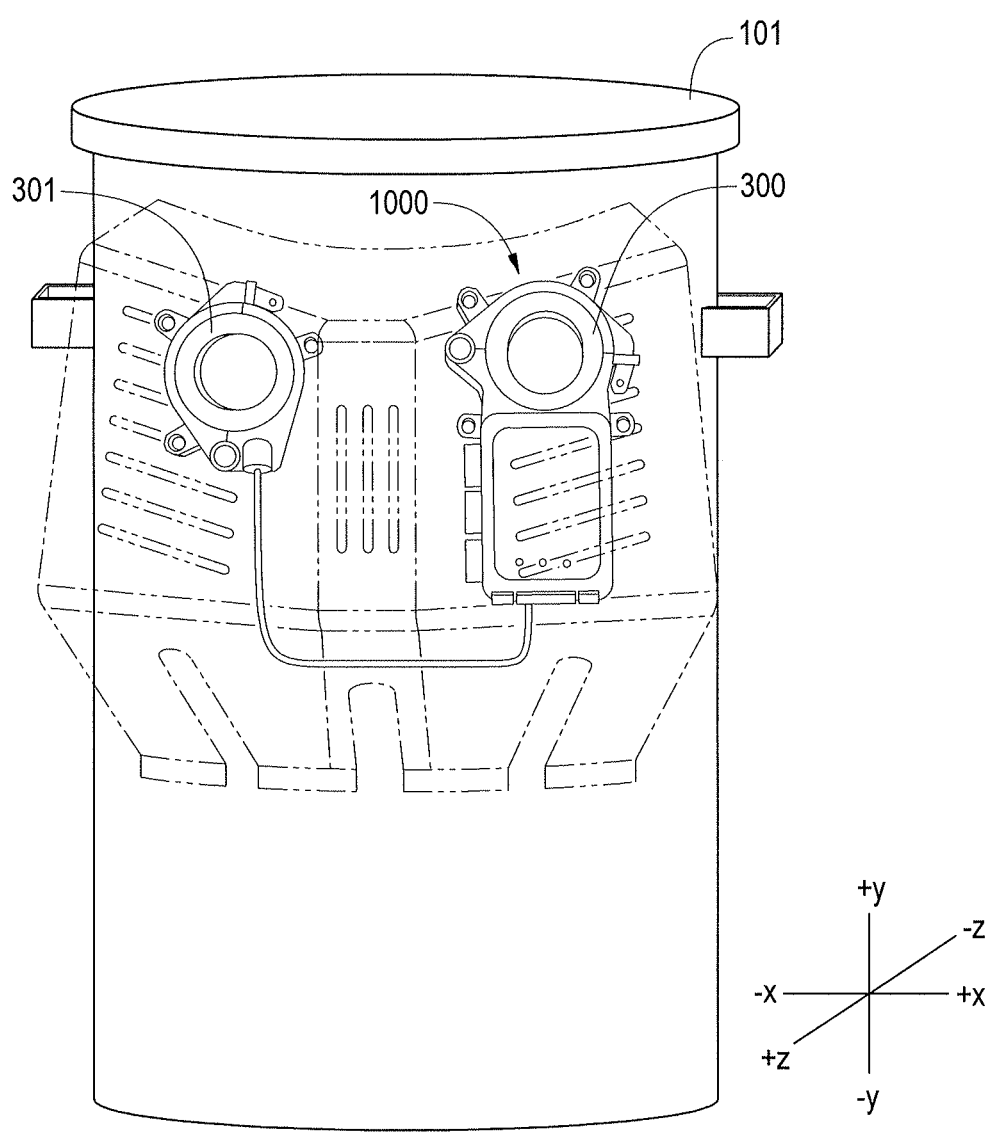
FIG. 3 is a front view of the protective cover depicted in FIG. 2 housing and protecting the transformer monitoring device depicted in FIG. 1.

FIG. 3 is a front view showing the monitoring device 1000 coupled to bushings 300 and 301. The device 1000 is coupled as described with reference to FIG. 1. Notably, the satellite unit 1021 is coupled around bushing 301, and the main unit 1001 is coupled around bushing 300. The monitoring device 1000 detects current and measures voltage related to the bushings. In one embodiment, conductors (not shown) are connected to the bushings 300 and 301 and are inserted through the slits 107-109 of the bottom plate 125 (FIG. 2). Notably, the protective cover 112 shown transparently covers and protects the monitoring device 1000 from theft, weather conditions and/or other types of damage that may be caused to the monitoring device 1000.

Figure 4:
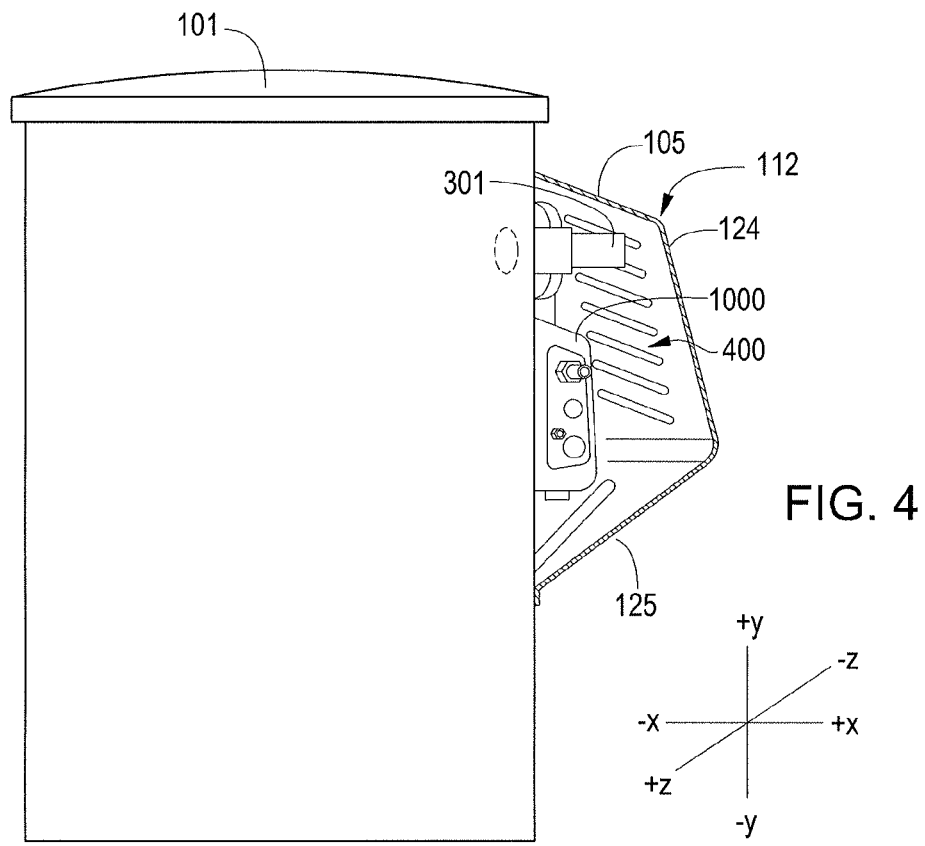
FIG. 4 is a side view of the protective cover depicted in FIG. 2 housing and protecting the transformer monitoring device depicted in FIG. 1.

FIG. 4 is a side cut-away view of the protective cover 112. Notably, the top plate 105, the front plate 124, and the bottom plate 125 create a compartment 400 in which the monitoring device 1000 is coupled to the bushing 301.

As shown, the top plate 105 slants downward angularly in a +x, −y direction allowing for the top portion of the monitoring device 1000 to be protected. Integral therewith is the front plate 124 and also angularly slopes downwardly in a +x, −y direction. Integral with the front plate 124 is the bottom plate 125 that slopes toward the transformer in a −x, −y direction. The plates 105, 124, and 125 fully protect the monitoring device 1000 contained within the compartment 400.

Figure 5:
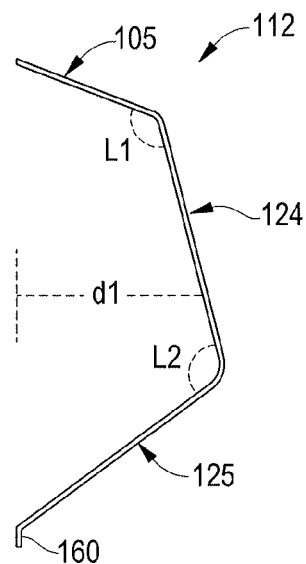
FIG. 5 is a side cross-sectional view of the protective cover depicted in FIG. 2.

FIG. 5 is a cross-sectional side profile view of the protective cover 112. As shown, the protective cover 112 comprises the top plate 105, the face plate 124, and the bottom plate 125. As noted hereinabove, top plate 105 is integral with face plate 124, and bottom plate 125 is integral with face plate 124.

The top plate 105 extends upward from the face plate 124 at an obtuse angle L1 from the face plate 124. Further, the bottom plate 125 extends downward from the face plate 124 at an obtuse angle L2 from the face plate 124.

Figure 6:
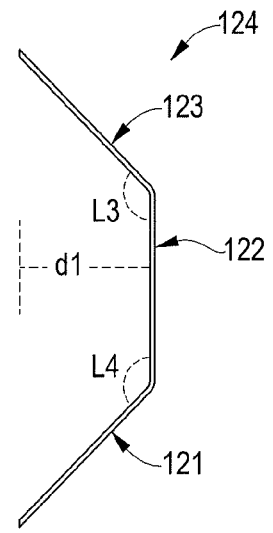
FIG. 6 is a top cross-sectional view of the protective cover depicted in FIG. 2.

FIG. 6 is a cross-section top profile view of the protective cover 112. As shown, the cross-sectional view depicts the face plate 124.

The face plate 124 comprises the plate side section 121 and 123 and the middle section 122. The plate side section 121 extends back from the middle section 122 toward the transformer at an obtuse angle L4, and plate side section 123 extends back from the plate side section 122 toward the transformer at an obtuse angle L3.

Note that there are a variety of ways in which the protective cover 112 may be coupled to the transformer 101 and protect the monitoring device 1000. In this regard, the protective cover 112 may be bolted to the bushings 300, 301 (FIG. 3). In another embodiment, a metal band (not shown) may be welded, or securely attached to the protective cover 112, wrapped around the transformer 101 and secured on the opposing side.

What is claimed is:

1. A power monitoring system, comprising:
at least one power monitoring device comprising a housing that houses electronic components, the power monitoring device coupled to at least two conductors of a transformer for collecting data indicative of power usage corresponding to the at least two conductors, the power monitoring device comprising a main unit electrically coupled via a cable to a satellite unit such that the satellite unit is freely movable in any direction relative to the main unit and the main unit is coupled about one of the at least two conductors and the satellite unit is coupled about the other one of the at least two conductors;
a protective cover separate from the power monitoring device and coupled over the power monitoring device without contacting any portion of the power monitoring device, the protective cover comprising a substantially arch-shaped top plate having an arch-shaped back edge adapted to abut and conform with an outside surface of the transformer and the top plate extends at an obtuse angle from a surface of the transformer, a substantially triangular face plate having a top beveled edge and integral with and extending from the top plate, the face plate comprising a substantially rectangular central face plate and trapezoidal-shaped two side plates, the central face plate extends at an obtuse angle from the top plate angled away from the transformer and each side plate integral with the central plate and the top plate, wherein each side plate extends at an obtuse angle from a respective side edge of the central face plate, and a bottom plate integral with and extending from the face plate and having an arch-shaped back edge adapted to couple, abut and conform with the outside surface of the transformer the bottom plate extending at an obtuse angle from the face plate and contacting the surface of the transformer, the protective cover further comprising open sides for releasing heat, wherein the bottom plate comprises a plurality of slots configured for releasing heat into the environment and for receiving cables that are to be connected to the transformer, wherein the protective cover is configured to efficiently dissipate heat.

2. The power monitoring system of claim 1, wherein the least two conductors are cables.

3. The power monitoring system of claim 1, wherein the at least two conductors are bushings.

4. The power monitoring system of claim 1, wherein the top plate intersects with the face plate at an obtuse angle.

5. The power monitoring system of claim 4, wherein the bottom plate intersects with the face plate at an obtuse angle.

6. The power monitoring system of claim 1, wherein the face plate comprises a plurality of vents for releasing heat.

7. The power monitoring system of claim 1, wherein the top plate has a width of at least four inches.

8. The power monitoring system of claim 1, wherein the first side plate is integral with the central face plate and intersects with the central face plate at a first edge.

9. The power monitoring system of claim 8, wherein the first side plate extends toward the transformer angularly from the first edge.

10. The power monitoring system of claim 9, wherein the second side plate is integral with the central face plate and intersects with the central face plate at a second edge.

11. The power monitoring system of claim 10, wherein the second side plate extends toward the transformer angularly from the second edge.

12. The power monitoring system of claim 1, wherein the bottom plate comprises a lip adapted for contacting the outside surface of the transformer.

* * * * *